United States Patent
Dai et al.

(10) Patent No.: US 7,488,455 B2
(45) Date of Patent: Feb. 10, 2009

(54) APPARATUS FOR THE PRODUCTION OF CARBON NANOTUBES

(75) Inventors: Liming Dai, Hudson, OH (US); Shaoming Huang, Glen Waverley (AU); Oddvar Johansen, Somerville (AU); Albert Mau, Glen Waverley (AU); Ernst Hammel, Vienna (AT); Xinhe Tang, Vienna (AT)

(73) Assignee: Commonwealth Scientific and Industrial Research Organisation, Campbell, Australian Capital Territory (AU)

( * ) Notice: Subject to any disclaimer, the term of this patent is extended or adjusted under 35 U.S.C. 154(b) by 154 days.

(21) Appl. No.: 11/487,510

(22) Filed: Jul. 17, 2006

(65) Prior Publication Data

US 2009/0010822 A1    Jan. 8, 2009

Related U.S. Application Data

(62) Division of application No. 10/474,066, filed as application No. PCT/AU02/00437 on Apr. 4, 2002, now abandoned.

(30) Foreign Application Priority Data

Apr. 4, 2001    (AU)    ............... PR4217/01

(51) Int. Cl.
  C09C 1/00    (2006.01)
  C23C 16/26    (2006.01)
(52) U.S. Cl. ............ 422/150; 423/447.3; 427/593
(58) Field of Classification Search .............. 422/150; 423/447.3; 427/593
  See application file for complete search history.

(56) References Cited

U.S. PATENT DOCUMENTS

| | | | |
|---|---|---|---|
| 6,232,706 B1 | 5/2001 | Dai et al. | |
| 6,808,746 B1* | 10/2004 | Dai et al. | ............ 427/249.1 |
| 6,855,376 B2* | 2/2005 | Hwang et al. | ............ 427/404 |
| 6,887,451 B2* | 5/2005 | Dodelet et al. | ............ 423/447.3 |
| 7,056,479 B2* | 6/2006 | Dodelet et al. | ............ 422/186 |
| 2001/0009693 A1 | 7/2001 | Lee et al. | |
| 2002/0004028 A1 | 1/2002 | Margrave et al. | |
| 2002/0102353 A1 | 8/2002 | Mauthner et al. | |

FOREIGN PATENT DOCUMENTS

EP    1 061 041    12/2000

(Continued)

OTHER PUBLICATIONS

"Structure and Growth of Aligned Carbon Nanotube films by Pyrolysis", De-Chang Li et al., Chemical Physics Letters, 316(2000) 349-355.*

(Continued)

Primary Examiner—N. Bhat
(74) Attorney, Agent, or Firm—Sughrue Mion, PLLC (57) ABSTRACT

A reactor for preparing carbon nanotubes comprising a reaction chamber, at least one support means located within said reaction chamber capable of supporting a substrate, said substrate being capable of supporting carbon nanotube growth, at least one heating element located within said reaction chamber capable of providing localized heating to said substrate within said reaction chamber, and means for passing a gaseous carbonaceous material into said reaction chamber such that is passes over the contacts said substrate.

15 Claims, 5 Drawing Sheets

FOREIGN PATENT DOCUMENTS

| | | |
|---|---|---|
| EP | 1 149 932 | 10/2001 |
| EP | 1149932 * | 10/2001 |
| WO | WO 00/63115 | 10/2000 |
| WO | WO 00/73203 | 12/2000 |
| WO | WO 00/73204 | 12/2000 |
| WO | WO 00/79612 | 12/2000 |
| WO | WO 01/21863 | 3/2001 |
| WO | WO 01/23303 | 4/2001 |
| WO | WO 01/85612 | 11/2001 |

OTHER PUBLICATIONS

Dresselhaus et al, *Physics World*, pp. 33-38 (Jan. 1998).
Ajayan et al, *Rep. Prog. Phys.*, 60: 1025-1062 (1997).
Dagani et al, *C &E News*, pp. 31-34 (Jan. 11, 1999).
Schulz et al, *C &E News*, pp. 41-42 (May 1, 2000).
Lijima et al, *Letter to Nature*, 354:56-68 (1991).
Ebbesen et al, *Nature,* 358:220-222 (1992).
Endo et al, *J. Phys. Chem. Solids*, 54 (12): 1841-1848 (1993).
Ivanov et al, *Chemical Physics Letters*, 223:329-335 (1994).
Dai et al, *J. Phys. Chem. B*, 104:1891-1915 (2000).
Ren et al, *Science*, 282: 1105-1107 (1998).
Qin, *American Inst. of Phys., Applied Physics Letters*, 72(26):3437-3439 (1998).
Zhang, *Science*, 285(5434): 1719-1722 (1999).

* cited by examiner

APPARATUS FOR THE PRODUCTION OF CARBON NANOTUBES

This application is a Divisional of U.S. application Ser. No. 10/474,066, filed Mar. 26, 2004, now abandoned; which is a 371 of PCT/AU02/00437, filed Apr. 4, 2002; the disclosure of each of which is incorporated herein by reference.

This invention relates to carbon nanotubes, in particular to a process and apparatus for the preparation of carbon nanotubes.

Carbon nanotubes usually have a diameter in the order of 0.4 nanometers to 100 nanometers and a length of up to about 1 centimeter. These elongated nanotubes consist of carbon hexagons arranged in a concentric manner with both ends of the tubes normally capped by pentagon-containing fullerene-like structures. Carbon nanotubes may have a single wall or multiwall structure. They can behave as a semiconductor or metal depending on their diameter and helicity of the arrangement of graphitic rings in the walls, and dissimilar carbon nanotubes may be joined together allowing the formation of molecular wires with interesting electrical, magnetic, nonlinear optical, thermal and mechanical properties. These unusual properties have led to diverse potential applications for carbon nanotubes in material science and nanotechnology. Indeed, carbon nanotubes have been proposed as new materials for electron field emitters in panel displays, single-molecular transistors, scanning probe microscope tips, gas and electrochemical energy storages, catalyst and proteins/DNA supports, molecular-filtration membranes, and energy-absorbing materials (see, for example: M. Dresselhaus, et al., *Phys. World*, Jan. 33, 1998; P. M. Ajayan, and T. W. Ebbesen, *Rep. Prog. Phys.*, 60, 1027, 1997; R. Dagani, *C&E News*, Jan. 11, 31, 1999). The importance of carbon nanotechnology is evidenced by increasing research and development funding (*C & E News*, May 1, 2000, pp. 41-47).

For most of the above applications, it is highly desirable that the carbon nanotubes are aligned and/or formed into patterns so that the properties of the individual nanotubes can be easily assessed and they can be incorporated effectively into devices.

Carbon nanotubes have been synthesised using arc discharge (S. Iijima, *Nature*, 354, 56-68, 1991; T. W. Ebbesen and P. M. Ajayan, *Nature*, 358, 220-222, 1992) and catalytic pyrolysis (see, for example: M. Endo et al. *J. Phys. Chem. Solids*, 54, 1841-1848, 1994; V. Ivanov, et al. *Chem. Phys. Let.* 223, 329-335, 1994) and often exist in an randomly entangled state. Patterned and non-patterned carbon nanotube films having the nanotubes aligned perpendicularly with the substrate have been prepared by pyrolysis of iron (II) phthalocyanine in a flow reactor comprising a quartz glass tube heated by a dual furnace (*J. Phys. Chem. B.*, 104, 2000, 1891). Ren et al., have synthesised large arrays of well-aligned carbon nanotubes by radio-frequency sputter-coating of a thin nickel layer onto a substrate, followed by plasma-enhanced hot filament chemical vapour deposition of acetylene in the presence of ammonia gas at approximately 666° C. (*Science*, 282, 1998, 1105).

Carbon nanotubes may be prepared at a variety of temperatures, although generally higher temperatures, for example, 600° C. to 1100° C., are required for the preparation of aligned carbon nanotubes. For economic reasons it is preferable to prepare carbon nanotubes at lower temperatures, for example, between 300° C. to 800° C.

Carbon nanotubes can be prepared in flow reactors comprising a glass tube surrounded by a dual furnace. This technique results in the entire reactor, including the glass tube, being heated and maintained at pyrolysis temperature. Furthermore, carbon is not only deposited on the substrate, but also on the other hot surfaces in the reactor, such as the inside of the glass tube. The carbon deposits on the glass can obscure the view of the substrate, making it difficult to visually monitor the growth of the nanotubes. The positioning of the furnace also generally obscures the view of the substrate and the growth of the nanotubes.

It is an object of the present invention to overcome or at least alleviate one or more of the disadvantages of the prior art.

According to a first aspect of the invention there is provided a process for preparing carbon nanotubes comprising:
locating a substrate capable of supporting carbon nanotube growth in a localised heating zone within a reaction chamber, said localised heating zone being provided by a heating element located within said reaction chamber,
passing a gaseous carbonaceous material into said reaction chamber such that the gaseous material passes over and contacts said substrate in the localised heating zone, whereby said gaseous material undergoes pyrolysis under the influence of said heat to form carbon nanotubes on said substrate.

According to a second aspect of the invention there is provided a reactor for preparing carbon nanotubes comprising:
a reaction chamber,
at least one support means located within said reaction chamber capable of supporting a substrate, said substrate being capable of supporting carbon nanotube growth,
at least one heating element located within said reaction chamber capable of providing localised heating to said substrate within said reaction chamber,
means for passing a gaseous carbonaceous material into said reaction chamber such that it passes over and contacts said substrate.

According to the present invention the substrate is heated by a heating element in a localised heating zone within a reaction chamber, thereby avoiding the need to heat the entire reaction chamber to pyrolysis temperatures. While the pyrolysis can be achieved at any suitable temperature in the localised heating zone, the process of the invention conveniently allows the preparation of carbon nanotubes at temperatures as low as 300° C. The carbon nanotubes are grown on a substrate that is heated to the required temperature by the heating element. In view of the lower temperatures required and the fact that the heating is localised, the present invention can provide substantial energy and cost savings relative to conventional methods. Also, since the heating is localised to the heating zone, the growth of carbon nanotubes at sites within the reaction chamber other than on the substrate and the production of amorphous carbon byproducts inside the reaction chamber are minimised. This also leads to a cleaner reaction chamber and purer carbon nanotube films being formed. If amorphous carbon is deposited on other hot surfaces, for example, exposed areas of the heating element, they are readily removed by heating the heating element in air, causing the amorphous carbon to be oxidised to $CO_2$. The reaction chamber therefore may be easily cleaned.

The reaction chamber may be defined by one or more walls, and may be of any size or shape suitable for accommodating one or more heating elements. The wall(s) may be formed from any suitable material, including metals, such as steel, aluminium, copper, silver, platinum or alloys, glass, such as quartz glass, normal glass or the like, plastic, polymethylmethacrylate (PMMA), Mylar, polypropylene (PP), polyethylene (PE) or their composites, or a combination thereof. The localised heating zone in the vicinity of the heating element ensures that the temperature of the wall(s) of the chamber remain lower than the temperature in the localised heating zone where pyrolysis occurs. If the chamber is large enough, walls of the chamber remote from the heating zone will remain at ambient temperature. Preferably the reaction chamber is formed from glass or at least includes one or more glass panels. Preferably, the chamber is tubular and its walls are transparent or partially transparent. Advantageously, transparency allows the visual observation of carbon nanotube growth and therefore undesirable growth can be terminated at any stage. Visual observation also allows easier control of the length of the carbon nanotubes by stopping the growth process at a desired time.

The support means may be any support means capable of supporting a substrate within the reaction chamber and capable of withstanding the pyrolysis temperatures used. For example, the support means may be in the form of a solid block, plate, grate, bracket, cradle, stretcher, scaffold or the like and may be made from any suitable material, for example, metal or ceramic materials. The support means may be any size or shape suitable to support the substrate.

The heating element may be any suitable heating means capable of heating a substrate and providing a localised heating zone. For example, suitable heating means may include resistant wires, induction field, microwave radiation or infrared radiation. The localised heating zone can also be heated from a remote point by, for example, a focussed infrared beam or laser beam. In a preferred embodiment, the heating element also acts as the support means for the substrate. In this embodiment, the heating element preferably forms a flat surface upon which the substrate is supported. An example of a suitable heating element which also acts as a substrate support is a ceramic plate into which resistant wires have been inserted. The heating element/substrate support may be formed in any shape or size appropriate to support and heat the substrate and heating zone. Preferably, the heating element allows the substrate to be heated homogenously, i.e., the temperature distribution of the heated substrate is homogenous. One means of achieving homogenous temperature distribution is to place a conducting material, for example, a copper sheet, between the heating plate and the substrate allowing even temperature distribution.

The reactor of the invention also includes a means for passing gaseous carbonaceous material into the reaction chamber such that it passes over and contacts the substrate. This means may be provided by at least one gas conduit. The at least one gas conduit is positioned to allow the flow of gaseous carbonaceous material into the localised heating zone. In a preferred embodiment, the inlet for the carbonaceous material is positioned directly above the substrate so that the gaseous carbonaceous material is supplied directly to the localised heating zone. Alternatively, the gaseous carbonaceous material may be supplied through an inlet at one end of the chamber and allowed to flow across the substrate in the localised heating zone. Multiple gas conduits may be used to supply gaseous carbonaceous material to a large localised heating zone or multiple localised heating zones located within the reaction chamber.

The at least one gas conduit may also be used as a gas inlet for supplying other gases to the reaction chamber and as a gas outlet to allow the exit of gases from the chamber. One gas conduit may be used as both gas inlet and gas outlet. Alternatively, multiple gas conduits may be used, each functioning as a gas inlet or gas outlet.

If a single gas conduit is used, it may be attached to all gas sources to be supplied to the chamber and a vacuum so the chamber may be evacuated. However, the vacuum may not be applied to the chamber at the same time as gas is supplied. The vacuum is not necessary if inert gases (e.g. Ar) are used to flush the reaction chamber.

A gas inlet may be used to supply reducing or inert atmospheres, for example, $H_2$ and/or nitrogen or argon, to the chamber before pyrolysis and to supply the gaseous carbonaceous material to be pyrolysed. These gases may be supplied through a single inlet or through separate inlets.

A gas outlet may be used to allow the exit of the unused gases and byproducts of the pyrolysis reaction. A gas outlet may be attached to a vacuum pump to allow evacuation of the reactor before the introduction of a reducing and/or inert atmosphere. The gas outlet may also be attached to a device, such as a bubbler, to allow a slight positive pressure of gas to be maintained in the chamber during the deposition of carbon nanotubes.

In the process of the invention, the substrate may be any substrate capable of withstanding the pyrolysis conditions employed and capable of supporting carbon nanotube growth. Examples of suitable substrates include quartz glass, mesoporous silica, nanoporous alumina, ceramic plates, glass, graphite and mica. Preferably the substrate is ordinary glass. Preferably the surface of the substrate upon which the carbon nanotubes are grown is smooth.

The gaseous carbonaceous material may be any carbonaceous compound or substance which may be gasified and which is capable of forming carbon nanotubes when subjected to pyrolysis. Examples of such compounds are alkanes, alkenes, alkynes and aromatic hydrocarbons, for example, methane, ethylene, benzene or acetylene. Preferably the carbonaceous material is acetylene.

Pyrolysis is performed in the presence of a catalyst. The catalyst may be any compound, element or substance suitable for catalysing the conversion of a carbonaceous material to carbon nanotubes under the pyrolysis conditions. Preferably the catalyst comprises a transition metal including Ni, Fe, Co, Al, Mn, Pd, Cr or alloys thereof in any suitable oxidation state. Most preferably, the catalyst comprises Ni. For example, the catalyst may be prepared from polyvinylalcohol/$Ni(NO_3)_2.6H_2O$ (PVA Ni.) Preferably, the surface of the substrate is coated with a substance from which the catalyst is prepared. For example, a spin-coated PVA Ni layer, subjected to oxidation at 500° C. for 30 minutes and reduction at 600° C. for 30 minutes provided a catalyst coating showing strong adhesion onto a glass substrate, even when subjected to compressed air. Reduction of the coating in the reactor is readily performed by supplying a mixture of $H_2$/Ar to provide the catalyst-coated substrate. The substrate may then be maintained in an inert atmosphere, for example, nitrogen or argon, to prevent the catalyst being oxidised.

The pyrolysis conditions employed will depend on the nature of the gaseous carbonaceous material, the catalyst used, and the length and density of the carbon nanotubes required. It is possible to vary the pyrolysis conditions, such as temperature, time, catalyst, pressure or flow rate through the reactor to obtain carbon nanotubes having different characteristics.

Pyrolysis may be performed at temperatures above 300° C. Preferably in the process of the invention temperatures in the heating zone are between 400° C. and 800° C. The selection of catalyst affects the temperature at which carbon nanotubes may be formed. The carbon formed during pyrolysis is then selectively deposited on the hot surface of the substrate in the heating zone, forming carbon nanotubes. Temperatures below 400° C. are demonstrated to be suitable for the nanotube growth with the ratio of carbon nanotubes to carbon nanofibre, their morphology and alignment depending on the conditions used. Surprisingly, it was found using the process of the present invention that well-aligned carbon nanotubes were easily formed well below the softening point of normal glass plates (ca. 640° C.). Within the temperature ranging from 400° C. and 800° C., the nanotube deposition is completed within a couple of seconds to 20 minutes. The formation of carbon nanotubes is a typical transient reaction and its deposition rate can be controlled by adjusting the pressure of the carbonaceous gas. With a low feed of carbonaceous gas, the carbon nanotube growth is from edge to centre of the substrate. In contrast, a homogenous coating is seen over the substrate surface within a couple of seconds at a high gas feed rate. Therefore, the deposition reaction can be region-specifically controlled by controlling the feed of the carbonaceous gas.

The carbon nanotubes produced by the process may be aligned or non-aligned. Aligned or non-aligned carbon nanotubes may be selected for by varying temperatures, type of catalyst used and the density of the catalyst coating on the substrate. For example, a low density of catalyst coating will favour non-aligned carbon nanotube growth whereas a high density of catalyst coating will favour aligned carbon nanotube growth.

The length of aligned carbon nanotubes may be varied over a certain range (from a sub-micrometer to several tens of micrometers) in a controllable fashion by changing the experimental conditions such as the pyrolysis time and gas flow rate. The size and shape of the aligned carbon nanotube film is, in principle, limited only by the size and shape of the substrate.

According to one embodiment of the invention, the reaction chamber may have a pre-heating zone, where the substrate may be pre-heated to a predetermined temperature before entering the localised heating zone where carbon nanotube deposition occurs. The reaction chamber may also have a cooling zone where the substrate is cooled after carbon nanotube deposition is complete. In one embodiment of the invention, the reactor includes a means of moving a substrate from the pre-heating zone to the localised heating zone and from the localised heating zone to the cooling zone. For example, the substrate may sit on a transporting belt.

The reaction chamber of the present invention may be adapted to have multiple localised heating zones by having multiple heating elements located within the chamber. Carbon nanotubes may then be deposited on multiple substrates simultaneously or in separate areas of a larger substrate. In a reactor containing multiple localised heating zones, a gas inlet may be attached to a gas distributor which allows the gaseous carbonaceous material to be supplied to each of the multiple localised heating zones simultaneously. Alternatively, the gaseous carbonaceous materials may be supplied through an inlet at one end of the chamber and allowed to flow across each substrate and through each localised heating zone sequentially.

The reactor of the present invention may be adapted to allow continuous carbon nanotube deposition on multiple substrates by having a means of moving a substrate from a pre-heating zone to the localised heating zone before carbon nanotube deposition and a means of moving a substrate to a cooling zone after carbon nanotube deposition is complete. Continuous carbon nanotube production may be achieved by pre-heating a substrate or substrates in the pre-heating zone, moving the substrate or substrates to the localised heating zone, synthesising carbon nanotubes on the substrate or substrates, moving the substrate or substrates into the cooling zone, removing the cooled substrate or substrates having a carbon nanotube film deposited on it/them from the reactor, and supplying new substrate or substrates to the pre-heating zone. Generally only one step, e.g. pre-heating, carbon deposition or cooling, is performed at a certain part of the reactor at any one time. The process may be continuously repeated. The reduction of a substance from which the catalyst is prepared may also be performed in the reactor by supplying a mixture of $Ar/H_2$ to the chamber to provide the catalyst coated substrate.

In the continuous process, the substrate may be located in a first chamber and then transported to a second chamber having a pre-heating zone and/or localised heating zone and/or cooling zone. Advantageously, the reduction of a substance from which the catalyst is prepared may be performed in the first chamber to provide a catalyst coated substrate. The substrate may then be transported to the pre-heating zone or localised heating zone in the second chamber when the atmosphere in the first chamber has been flushed with inert gas. In a preferred embodiment, the two chambers are connected and the catalyst coated substrate may pass from the first chamber to the pre-heating zone or localised heating zone in the second chamber through a connecting door.

In a reactor adapted for use in the continuous process of the invention, the localised heating zone and the cooling zone may be in the same chamber. Alternatively, the cooling zone may be in a separate chamber from the localised heating zone. If the localised heating zone and cooling zone are in separate chambers, the two chambers may be connected such that the substrate in the localised heating zone may be transferred to the cooling zone via a connecting door after carbon deposition has occurred.

According to the present invention it is possible to prepare multilayer carbon nanotube materials by synthesising a first layer of carbon nanotubes on a substrate under a first set of pyrolysis conditions, and then synthesising a second layer of carbon nanotubes on the nanotube coated substrate under a second set of pyrolysis conditions.

This process may be repeated until the desired number of carbon nanotube layers are present. Each layer of carbon nanotubes may be deposited using the same or different pyrolysis conditions. After preparation of the multilayer structure the carbon nanotube film may be removed from the substrate using appropriate conditions.

It is also possible according to the present invention to prepare hetero-structured multilayer carbon nanotube films by interposing layers of carbon nanotubes between layers of pyrolysis resistant materials, the carbon nanotubes being generated in accordance with the process of the present invention.

The term "hetero-structured" as used herein refers to a multilayer structure which includes one or more carbon nanotube layers together with layers of other materials.

The pyrolysis resistant material may be a metal, preferably Au, Pt, Ni, Cu, a semiconductor, $TiO_2$, $MgO$, $Al_2O_3$, $ZnO$, $SnO_2$, $Ga_2O_3$, $In_2O_3$, $CdO$ or a polymer or any other pyrolysis resistant material that is capable of supporting the nanotube growth.

The pyrolysis resistant material may be applied to the carbon nanotube coated substrate by any suitable means. Preferably metals are applied by sputter-coating, polymers are applied by spin-casting and semiconductors by sputter-coating or physical deposition.

As is evident from the above description, the process and apparatus of the invention allow the preparation of a large variety of carbon nanotube films and structures. It is also possible to provide patterned layers using appropriate masking and etching techniques. At lower temperatures it may be possible to use the reactor of the invention to prepare carbon nanofibres or mixtures of carbon nanotubes and nanofibres.

The materials produced by the present invention may be used in the construction of devices for practical applications in many fields including electron emitters, field-emission transistors, electrodes for photovoltaic cells and light emitting diodes, optoelectronic elements, bismuth actuators, chemical and biological sensors, gas and energy storages, molecular filtration membranes and energy-absorbing materials.

Figure 1:
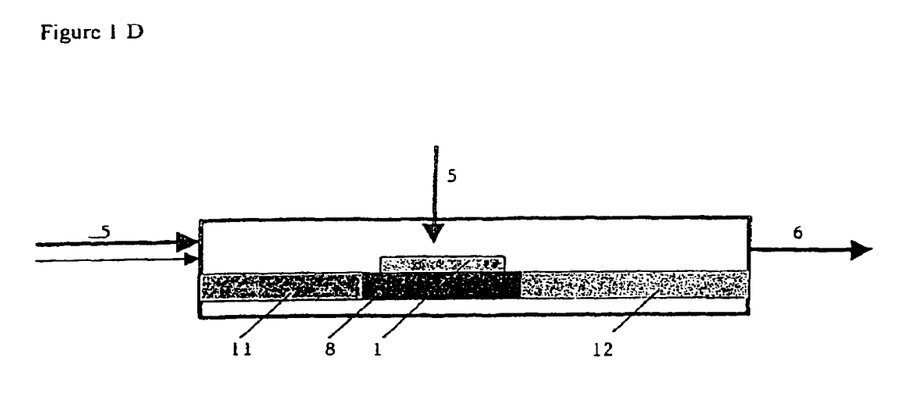

The invention can be more fully understood from the following detailed description of FIG. 1 and the examples. It should be understood that the examples and Figures described are only for illustration purposes, which does not intend to constitute a limitation on the invention.

BRIEF DESCRIPTION OF THE DRAWINGS

FIG. 1AA is a diagrammatic side-view representation of a pyrolysis flow reactor of the invention having a gas inlet at one end of the chamber, and a gas outlet at the other.

FIG. 1AB is a diagrammatic side view representation of a pyrolysis flow reactor of the invention having a gas inlet positioned above the localised heating zone and gas outlets positioned on the respective ends of the reaction chamber.

FIG. 1AC is a diagrammatic end view representation of a pyrolysis reactor of the invention having a gas inlet positioned above the localised heating zone and a gas outlet positioned below.

FIG. 1BA is a diagrammatic side view representation of a pyrolysis reactor of the invention having multiple localised heating zones.

FIG. 1BB is a diagrammatic top view representation of a heating element supporting multiple substrates.

FIG. 1CA is a diagrammatic side view representation of a pyrolysis reactor of the invention having a pre-heating zone, a localised heating zone and a cooling zone and wherein inlet for supplying the gaseous carbonaceous material is positioned above the localised heating zone.

FIG. 1CB is a diagrammatic top plan view of a heating element having a pre-heating zone, a localised heating zone and a cooling zone.

FIG. 1D is a diagrammatic side plan view of a reactor of the invention in which a substrate may be moved from the pre-heating zone to the localised heating zone and finally to the cooling zone before removal from the reactor.

FIG. 1EA is a series of diagrammatic side plan views of a heating element designs suitable for use in the reactor of the invention.

FIG. 1EB is a diagrammatic top plan view of a heating element suitable for use in the reactor of the invention.

FIG. 1AA is a diagrammatic representation of a pyrolysis reactor of the invention in which a substrate (1) has been positioned on the heating element (2). The heating element (2) and substrate (1) are located within a reaction chamber (7) defined by chamber walls (3). A sheet of conducting material (4) is positioned between the substrate (1) and the heating element (2) in order to provide homogenous heating of the substrate (1). A gas inlet (5) is positioned at one end of the reaction chamber and a gas outlet (6) is positioned at the opposing end of the reaction chamber such that any gas introduced into the reaction chamber (7) flows from one end of the chamber to the other, flowing over the substrate (1).

FIG. 1AB is a diagrammatic representation of a pyrolysis reactor of the invention similar to that shown in FIG. 1AA but having a gas inlet (5) positioned above the heating element (2) upon which the substrate (1) is supported. The gas is supplied directly into the localised heating zone (8). Gas outlets (6) are located at each end of the chamber.

FIG. 1AC is a diagrammatic end view representation of a pyrolysis reactor of the invention similar to that shown in FIG. 1AA or 1AB but having a gas outlet (6) located below the localised heating zone (8).

In operation, the reactor shown in FIGS. 1AA to 1AC is flushed with an inert gas such as $N_2$ or Ar, or is evacuated by means of a vacuum pump connected to the gas outlet (6). A mixture of $H_2$ and Ar is introduced into the reaction chamber (7) to ensure the catalyst is in a reduced state. The heating element (2) is heated to the required temperature which heats the substrate (1) to the required temperature. When the catalyst has been reduced, a flow of Ar gas is maintained to ensure an inert atmosphere in the chamber. A gaseous carbonaceous material, such as ethylene, is introduced into the reaction chamber (7) through the gas inlet (5). Pyrolysis of the carbonaceous material occurs in the localised heating zone (8) and carbon is deposited on the hot surface of the substrate (1) to produce a carbon nanotube layer. The substrate (1) is then allowed to cool.

FIG. 1BA is a diagrammatic side view representation of a pyrolysis reactor of the invention in which multiple substrates (1) are positioned on a heating element (2). The heating element (2) and the substrates are located within a reaction chamber (7) defined by chamber walls (3). The gas inlet (5) is connected to a gas distributor (9) that allows the carbon-containing material to be simultaneously introduced into multiple localised heating zones (8). The gas outlet (6) is positioned at one end of chamber (7) and a connection to a vacuum pump (10) is positioned at the opposing end of chamber (7).

FIG. 1BB is a diagrammatic top plan view representation of the heating element (2) of the reactor shown in FIG. 1BA. Multiple substrates (1) are positioned on the heating element (2).

In operation, the reactor shown in FIG. 1BA is evacuated by a vacuum pump connected to outlet (10) and a mixture of $H_2$ and Ar is introduced into the reaction chamber (7). The heating element (2) is heated to the required temperature which heats the multiple substrates (1) to the required temperature. When the catalyst has been reduced, a positive pressure of inert atmosphere (Ar) is maintained in the reaction chamber (7). A gaseous carbonaceous material is introduced into multiple localised heating zones (8) from the gas inlet (5) by means of a gas distributor (9). Pyrolysis of the carbonaceous material occurs in the multiple localised heating zones (8) and carbon is deposited on the hot surfaces of the multiple substrates (1) to produce a carbon nanotube layer on each of the multiple substrates (1). The substrates are then allowed to cool. Multiple substrates are simultaneously coated with a layer of carbon nanotube in this reactor.

FIG. 1CA is a diagrammatic side view representation of a pyrolysis reactor of the invention in which a substrate (1) is positioned on the heating element (2). The heating element (2) and the substrate (1) is located within the reaction chamber (7) defined by chamber walls (3). The heating element (2) is divided into zones having different temperatures, a pre-heating zone (11), a localised heating zone (8) and a cooling zone (12). The gas inlet (5) is positioned above the localised heating zone (8) and distributes the gaseous carbonaceous material evenly over the substrate (1) when it is in the localised heating zone (8). The gas outlet (6) is positioned at one end of the chamber (7) and a connection to a vacuum pump (10) is positioned at the opposing end of the chamber (7).

FIG. 1CB is a diagrammatic top plan view representation of a heating element (2) of the reactor shown in FIG. 1CA. A substrate (1) is initially positioned in the pre-heating zone (11), then the substrate is moved to the localised heating zone and finally the substrate is moved to the cooling zone (12).

In operation, a substrate (1) is pre-heated to a predetermined temperature in the pre-heating zone (11). The substrate (1) is then moved to the localised heating zone (8) and is heated to pyrolysis temperature. A gaseous carbonaceous material is introduced into the localised heating zone (8) through gas inlet. The gaseous carbonaceous material is pyrolysed and carbon nanotubes are deposited on the surface of the substrate (1). The substrate (1), upon which carbon nanotubes have been deposited, is moved to the cooling zone (12) and allowed to cool before being removed from the reactor. The reactor may also include a mechanism for transferring the cooled substrate (1) having a film of carbon nanotubes out of the reactor and a mechanism for positioning a new substrate in the pre-heating zone. The reactor may also include a mechanism which allows transfer of a substrate from one zone to the next within the chamber. (7) The process may be performed in a continuous manner, for example, the substrate may sit on a transporting belt. Such a device is also illustrated in FIG. 1D.

FIGS. 1EA to 1ED show a series of heating element (2)/conducting material (4)/substrate (1) configurations which may be useful in the reactor of the invention. In FIG. 1EA, the sheet of conducting material (4) and the substrate (1) are embedded in the heating element (2). In FIG. 1EB, the sheet of conducting material (4) is embedded in the heating element (2) and a substrate (1) which is smaller than the heating element (2) is placed in the heating element (2) on the conducting metal sheet (4). In FIG. 1EC, the surface of the heating element (2) is flat and a substrate (1) having a smaller surface than the heating element (2) is placed on a sheet of conducting material (4) also having a smaller surface than the heating element (2). The sheet of conducting material (4) and the substrate (1) protrude above the surface of the heating element (2). In FIG. 1ED, the heating element (2) is coated with a conducting material (4) across its entire surface and a substrate (1) is positioned on top of the conducting material coating. The configuration in FIG. 1ED is the most suitable for use in a reactor where continuous carbon nanotube deposition occurs, for example, the reactor shown in FIG. 1C or FIG. 1D.

FIG. 1EE is a diagrammatic top plan view of a preferred heating element (2) having a substrate (1) positioned on it. The heating element (2) has a sheet of conducting material (4) placed on it to provide homogenous temperature distribution and a resistant wire (13) is supported within the heating element to heat the heating element.

EXAMPLES

Example 1

Preparation of Non-Aligned Carbon Nanotubes

Figure 1A:
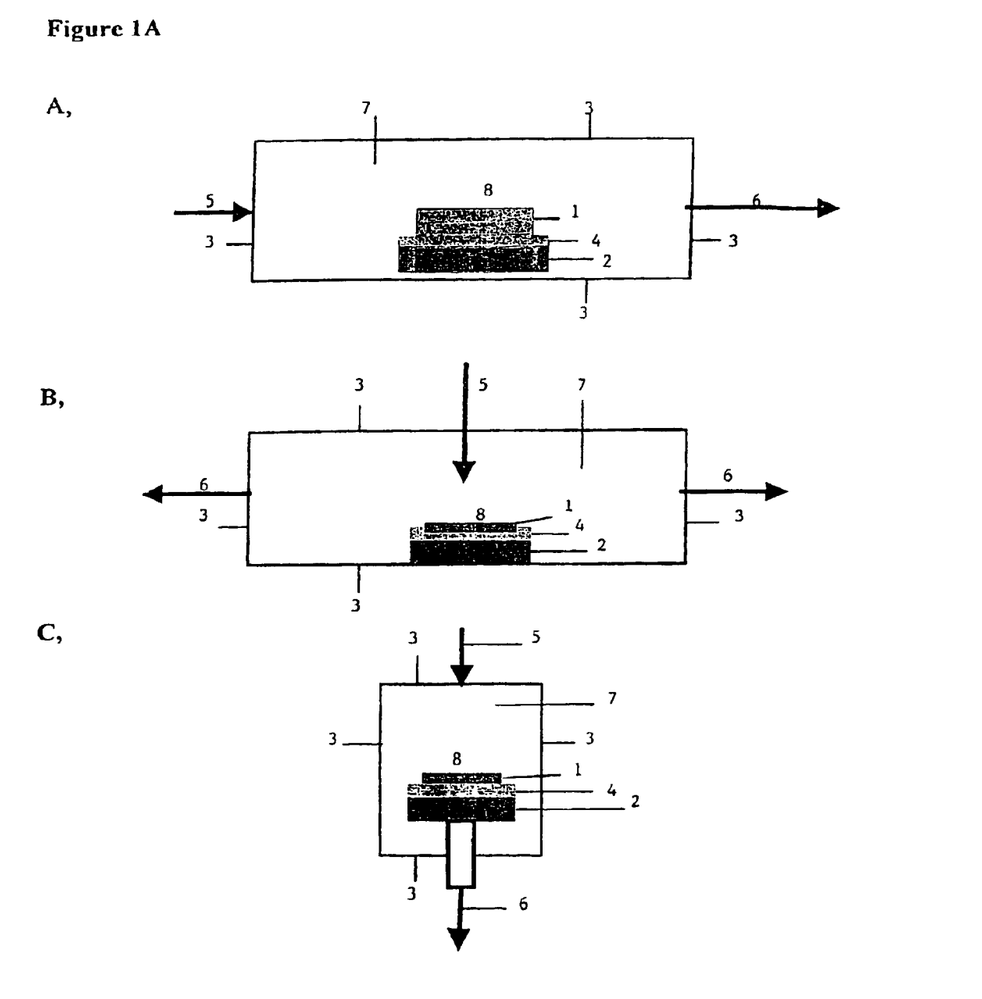
Figure 1B:
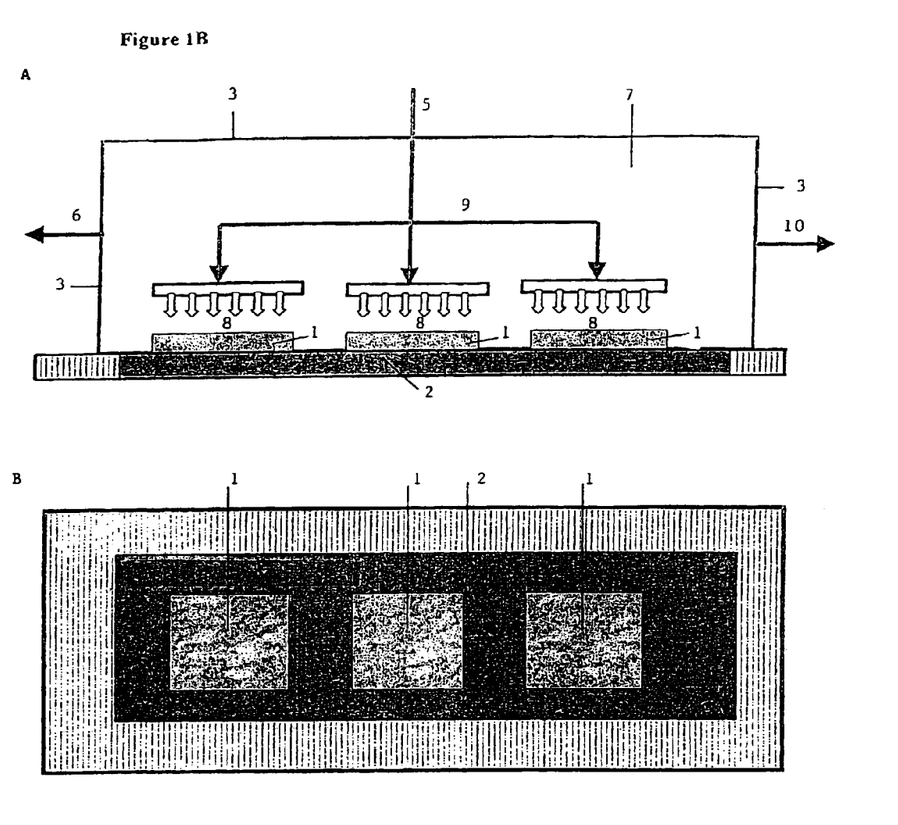
Figure 1C:
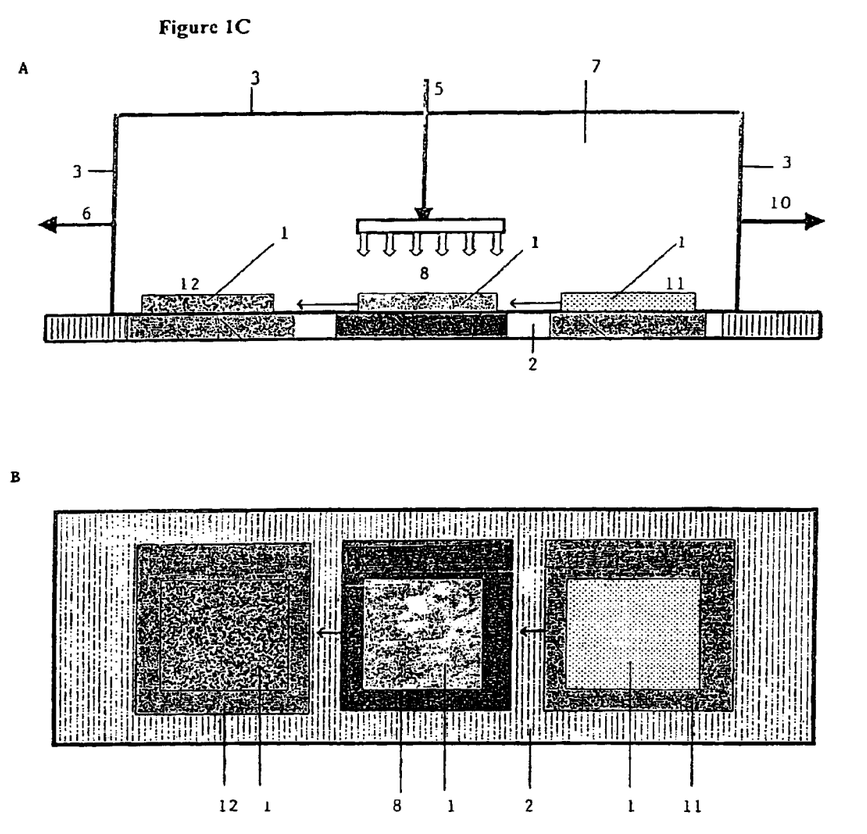
Figure 1E:
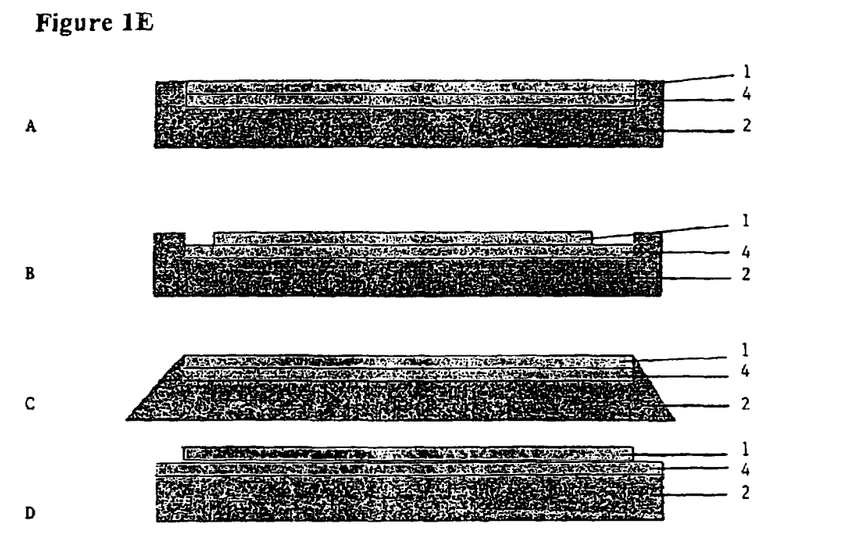

A glass substrate was spin-coated with a PVA Ni layer (100 mM $Ni(NO_3)_2.6H_2O$ and 3 wt % PVA) to provide a catalyst for deposition of carbon nanotubes. The coated substrate was oxidised at 500° C. for 30 minutes and reduced at 600° C. for 30 minutes. After such treatment, the catalyst coating was strongly adhered to the substrate. The catalyst-coated substrate was placed in the reactor as shown in FIG. 1A and the atmosphere in the reaction chamber was replaced with $H_2/Ar$ to ensure the catalyst was in a reduced state. The substrate was heated at 650° C. on the heating element and acetylene/Ar gas (V:V=1:3), introduced at a total flow rate of 60 ml/min for a time of 3 minutes, was pyrolysed resulting in the deposition of non-aligned carbon nanotubes on the catalyst-coated substrate.

Example 2

Preparation of Aligned Carbon Nanotubes

Aligned carbon nanotubes were prepared by the same method as applied in Example 1, but at a lower temperature (440° C.) was used. The resulting carbon nanotubes align almost normal to the substrates surface and are densely packed with a fairly uniform tubular length of ca. 1 μm.

The claims defining the invention are as follows:

1. A reactor for preparing carbon nanotubes comprising:
a reaction chamber,
at least one support means located within said reaction chamber capable of supporting a substrate, said substrate being capable of supporting carbon nanotube growth,
at least one heating element located within said reaction chamber capable of providing localized heating to said substrate within said reaction chamber and wherein the at least one heating element also acts as the at least one support means for the substrate,
means for passing a gaseous carbonaceous material into said reaction chamber such that it passes over and contacts said substrate.

2. A reactor according to claim 1, wherein the reaction chamber is formed from metal, glass, plastic or a combination thereof.

3. A reactor according to claim 2, wherein the reaction chamber is formed from glass or comprises at least one glass panel.

4. A reactor according to claim 1, wherein the heating element comprises resistant wires.

5. A reactor according to claim 1, wherein the heating element is located within the substrate support.

6. A reactor according to claim 5, wherein the heating element and substrate support comprise a ceramic plate into which resistant wires have been inserted.

7. A reactor according to claim 1, wherein the means for passing a gaseous carbonaceous material into the reaction chamber is at least one gas conduit.

8. A reactor according to claim 7, wherein the at least one gas conduit is located above the substrate.

9. A reactor according to claim 7, wherein the at least one gas conduit is located to allow the gaseous carbonaceous material to flow across the surface of the substrate.

10. A reactor according to claim 1 comprising multiple support means and multiple heating elements.

11. A reactor according to claim 1, further comprising a pre-heating zone.

12. A reactor according to claim 11, wherein the pre-heating zone is located in a separate chamber from the reaction chamber.

13. A reactor according to claim 1, further comprising a cooling zone.

14. A reactor according to claim 13, wherein the cooling zone is located in a separate chamber from the reaction chamber.

15. A reactor according to claim 1, further comprising a means of transferring a substrate from a pre-heating zone to a support means and/or from the support means to a cooling zone.

* * * * *